United States Patent [19]

Kimura et al.

[11] Patent Number: 5,504,388
[45] Date of Patent: Apr. 2, 1996

[54] PIEZOELECTRIC/ELECTROSTRICTIVE ELEMENT HAVING ELECTRODE FILM(S) WITH SPECIFIED SURFACE ROUGHNESS

[75] Inventors: Koji Kimura; Satoshi Takemoto, both of Nagoya; Yukihisa Takeuchi, Aichi, all of Japan

[73] Assignee: NGK Insulators, Ltd., Japan

[21] Appl. No.: 207,041

[22] Filed: Mar. 8, 1994

[30] Foreign Application Priority Data

Mar. 12, 1993 [JP] Japan .................................. 5-078804

[51] Int. Cl.$^6$ .................................................. H01L 41/08
[52] U.S. Cl. ........................... 310/363; 310/328; 310/330; 310/364; 310/365
[58] Field of Search ...................... 310/357–359, 310/328, 324, 330–332, 363, 364, 365, 366

[56] References Cited

U.S. PATENT DOCUMENTS

| | | | |
|---|---|---|---|
| 5,089,455 | 2/1992 | Ketcham et al. ................ | 501/104 |
| 5,126,615 | 6/1992 | Takeuchi et al. ................ | 310/330 |
| 5,210,455 | 5/1993 | Takeuchi et al. ................ | 310/328 |
| 5,281,888 | 1/1994 | Takeuchi et al. ................ | 310/366 |

FOREIGN PATENT DOCUMENTS 62-213399  9/1987  Japan .
2161647   1/1986  United Kingdom .

*Primary Examiner*—Mark O. Budd
*Attorney, Agent, or Firm*—Parkhurst, Wendel & Burr

[57] ABSTRACT

A piezoelectric/electrostrictive element is disclosed which includes at least one piezoelectric/electrostrictive portion each of which consists of a lower electrode film, a piezoelectric/electrostrictive film and an upper electrode film. In this element, at least the lower one of the electrode films has a surface roughness represented by maximum peak-to-valley roughness height Rmax. or Ry which is in a range of 3 μm~14 μm, and a surface roughness represented by centerline mean roughness Ra which is not larger than 2 μm.

17 Claims, 1 Drawing Sheet

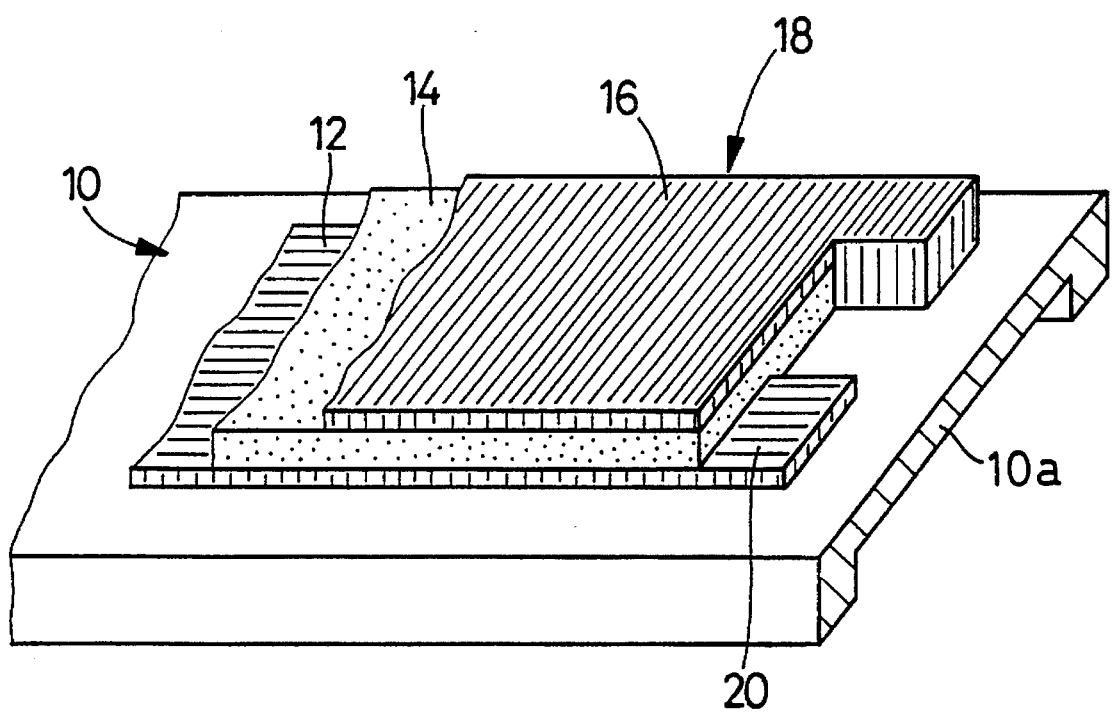

PIEZOELECTRIC/ELECTROSTRICTIVE ELEMENT HAVING ELECTRODE FILM(S) WITH SPECIFIED SURFACE ROUGHNESS

BACKGROUND OF THE INVENTION

1. Field of the Invention

The present invention relates to a uni-morph, bi-morph or other type of piezoelectric or electrostrictive element as disclosed in co-pending U.S. patent application Ser. No. 07/912,920, which undergoes displacement in the form of bending, deflection or flexure and which can be suitably used for ink jet print heads, microphones, sounding bodies (such as loudspeakers), various resonators or vibrators, sensors, and other components or devices. The terms "piezoelectric element" and "electrostrictive element" used herein are interpreted to mean an element capable of transducing or converting an electric energy into a mechanical energy, i.e., mechanical force, displacement, strain or vibrations, or transducing a mechanical energy into an electric energy.

2. Discussion of the Related Art

In recent years, in the fields of optics and precision positioning or machining operations, for example, there have been widely used and increasingly demanded an element whose displacement is controlled for adjusting or controlling an optical path length or the position of a member or component of a device on the order of fractions of a micron ($\mu m$), and a detecting element adapted to detect infinitesimal displacement of a subject as an electric change. To meet the needs, there have been developed or proposed various piezoelectric or electrostrictive actuators or sensors utilizing a piezoelectric or electrostrictive material such as a ferroelectric material, which exhibits the reverse or converse piezoelectric effect or the electrostrictive effect, in which such a piezoelectric or electrostrictive material produces a mechanical displacement upon application of a voltage or electric field thereto, or which exhibits the piezoelectric effect in which the piezoelectric material produces a voltage or electric field upon application of pressure or mechanical stress.

For example, an ink jet print head uses conventional piezoelectric/electrostrictive elements of a uni-morph or bi-morph type, so as to effect a printing operation utilizing displacement of the elements. In order to improve the quality and speed of the printing operation, efforts have been made to reduce the size of the piezoelectric/electrostrictive elements so as to form these elements with higher density, and lower the required drive voltage for displacing the elements, assuring improved operating response of the elements. In the piezoelectric or electrostrictive elements of modern vintage, a lower electrode, a piezoelectric/electrostrictive film and an upper electrode are laminated in the order of description on a ceramic substrate which serves as a vibration plate, by a film-forming method, so as to form a piezoelectric/electrostrictive unit or electrostrictive portion on the substrate. These piezoelectric/electrostrictive portion and substrate are then heat-treated into an integral laminar structure which serves as a piezoelectric/electrostrictive element.

In the film-type piezoelectric/electrostrictive element as described above, components contained in the layer of the ceramic substrate and the films of the electrode and piezoelectric/electrostrictive materials may react with those contained in the adjacent film or layer, at the interfaces of these layer and films, particularly at the interfaces between the electrode films and the piezoelectric/electrostrictive film, during heat treatment of the laminar piezoelectric/electrostrictive portion which consists of the electrode and piezoelectric-electrostrictive films. Such reaction may change the composition of the piezoelectric/electrostrictive film, resulting in changing the characteristics of the element. To achieve high stability or consistency in the characteristics of the piezoelectric/electrostrictive element, it is effective to remove a glass component or components from the materials of the piezoelectric/electrostrictive and electrode films, so as to restrict or reduce the reaction between the films, since the glass components are likely to react with a compound containing lead, which compound is included in the piezoelectric/electrostrictive material.

Although the removal of the glass component or components from the materials of the electrode and piezoelectric/electrostrictive films advantageously makes it possible to avoid a change of the composition of the piezoelectric/electrostrictive films, it also results in reduced bonding strength between the electrode films and piezoelectric/electrostrictive film, in particular, between the lower electrode and piezoelectric/ electrostrictive films. Consequently, these films may be separated from each other due to the insufficient bonding thereof, leading to shortened service life, poor operating characteristics and reduced operating reliability of the piezoelectric/electrostrictive element.

In the conventional piezoelectric/electrostrictive element, the piezoelectric/electrostrictive film is formed on a flat surface of the lower electrode film formed on the ceramic substrate. Accordingly, stresses are likely to act on the piezoelectric/electrostrictive film during the heat treatment thereof, whereby the characteristics of the element may deteriorate due to the residual stresses. Further, when a considerably large stress is applied to the piezoelectric/electrostrictive film, cracks or other defects may take place on the film, resulting in a reduced yield of the piezoelectric/electrostrictive elements produced.

SUMMARY OF THE INVENTION

It is therefore an object of the present invention to provide a piezoelectric/electrostrictive element which exhibits an increased bonding strength between an electrode film and a piezoelectric/electrostrictive film of a piezoelectric/electrostrictive portion, assuring improved operating reliability and prolonged service life of the element. It is also an object of the invention to reduce stresses acting on the piezoelectric/electrostrictive film during heat treatment thereof, so as to improve the characteristics of the element and avoid cracking and other defects of the film.

The above objects may be accomplished according to the principle of the present invention, which provides a piezoelectric/electrostrictive element including a ceramic substrate, and at least one piezoelectric/electrostrictive portion each of which consists of a lower electrode film, a piezoelectric/electrostrictive film and an upper electrode film, which are laminated on the ceramic substrate in the order of description and formed into an integral laminar structure by heat treatment of at least the lower electrode film and the piezoelectric/electrostrictive film, wherein at least the lower electrode film has a surface roughness represented by maximum peak-to-valley roughness height Rmax. or Ry which is in a range of 3 $\mu m$–14 $\mu m$, and a second surface roughness represented by centerline mean roughness Ra which is not larger than 2 $\mu m$.

In the piezoelectric/electrostrictive element according to the present invention, at least the lower one of the electrode films of the piezoelectric/electrostrictive portion is formed with local minute projections and recesses present on a generally flat surface thereof, such that the electrode film has a surface roughness represented by maximum peak-to-valley roughness height Rmax. or maximum height of profile Ry which is in the range of 3 μm~14 μm, and a surface roughness represented by centerline mean roughness Ra which is not larger than 2 μm. Accordingly, the piezoelectric/electrostrictive film, when formed on the lower electrode film, engages the local projections and recesses of the lower electrode film, assuring a significantly increased contact area between the electrode film and the piezoelectric/electrostrictive film, without affecting the composition of the piezoelectric/electrostrictive film. The thus increased contact area provides an enhanced effect of anchoring the piezoelectric/electrostrictive film to the electrode film, assuring sufficiently high bonding strength at the interface therebetween. Consequently, the piezoelectric/electrostrictive element operates with improved reliability, for a prolonged lifetime, without suffering from separation or peeling-off of the films of the piezoelectric/electrostrictive portion.

Further, the local minute projections and recesses formed on a generally flat surface of the electrode film are effective to reduce stresses that are applied to the piezoelectric/electrostrictive film during heat treatment thereof. Consequently, the piezoelectric/electrostrictive film is less affected by the residual stresses, thus permitting improved performance (such as displacement) of the piezoelectric/electrostrictive element. Further, cracks and other defects are less likely to occur in the piezoelectric/electrostrictive film, which leads to an increased yield ratio of the elements produced.

In a preferred arrangement of the present invention, the lower electrode film is formed from an electric conductor paste made of an electrically conductive composition in the form of a powder which is a mixture of at least two kinds of solid particles having different average particle sizes. This arrangement facilitates accurate control of the surface roughness of the electrode film.

In another preferred arrangement of this invention, the lower electrode film consists of a porous electrode film having pores which are open on a surface thereof on which the piezoelectric/electrostrictive film is formed.

BRIEF DESCRIPTION OF THE DRAWINGS

The above and optional objects, features and advantages of the present invention will be better understood by reading the following detailed description of a presently preferred embodiment and examples of this invention, when considered in connection with the accompanying drawing, in which the single figure is a perspective view showing the structure of a piezoelectric/electrostrictive element embodying the present invention.

DETAILED DESCRIPTION OF THE PRESENT INVENTION

According to the present invention, at least the lower electrode film is formed such that its surface has a surface roughness represented by maximum peak-to-valley roughness height Rmax. or maximum height of profile Ry which is in the range of 3~14 μm, and a surface roughness represented by centerline mean roughness Ra which is not larger than 2 μm. More preferably, the surface roughness Rmax. is in the range of 5~10 μm, and the surface roughness Ra is not larger than 1 μm. If the surface roughness values Rmax. and Ra are greater than the respective upper limits indicated above, the thickness of the piezoelectric/electrostrictive film formed on the electrode film tends to have a relatively large variation, thereby causing a variation or fluctuation in the electric field applied to the piezoelectric/electrostrictive film, which results in deterioration of the operating characteristics of the element. At the same time, dielectric breakdown tends to occur due to concentration of the electric field on local areas of the piezoelectric/electrostrictive film, resulting in reduced reliability in terms of electric insulation. Further, pores tend to be formed between the electrode film and the piezoelectric/electrostrictive film. Such pores adversely reduce the bonding strength therebetween. It is to be understood that "Rmax." is one of main parameters indicative of the surface roughness of an industrial product, that is, represents the maximum peak-to-valley roughness height which is the distance between two lines parallel to the mean line that contact the extreme upper and lower points on a profile of the surface to be measured within the roughness sampling length. On the other hand, "Ra", which is also one of main parameters indicative of the surface roughness of an industrial product, represents centerline mean roughness which is the arithmetic average deviation from the centerline, that is, the arithmetic average or mean of the absolute values of the profile departures within the sampling length.

The electrode films as described above may be formed of any electrically conductive material which can withstand a high-temperature oxidizing atmosphere. For instance, the electrode films may be formed of a single metal, a metal alloy, a mixture of a metal or alloy and an electrically insulating ceramic (e.g., $TiO_2$, $Al_2O_3$, $ZrO_2$), or an electrically conductive ceramic. However, it is preferable that the electrode material has a major component which consists of a noble metal having a high melting point, such as platinum, palladium or rhodium, or an alloy such as silver-palladium alloy, silver-platinum alloy or platinum-palladium alloy. It is also preferable to use as the electrode material a cermet of platinum and a material for a ceramic substrate (which will be described) or a material for the piezoelectric/electrostrictive film. It is particularly desirable to use a material which is solely formed of platinum, or a material whose main component is an alloy containing platinum. For improving the wettability with respect to the ceramic substrate, an additive such as bismuth oxide may be added to the electrode material. Where the cermets as described above are used as the electrode material, the content of the substrate material to be included in the electrode material is preferably within a range of about 5–30% by volume, while the content of the piezoelectric/electrostrictive material to be included in the electrode material is preferably within a range of about 5–20% by volume. Further, it is desirable to avoid using glass as an additive to the electrode, since the glass tends to promote reaction between the electrode films and the piezoelectric/electrostrictive film during heat treatment thereof, which results in deterioration of the operating characteristics of the element obtained.

To form the electrode films, there is normally used an electric conductor paste which is prepared by adding solid particles of the electrode material as indicated above, to an organic solvent together with a suitable organic binder. According to one preferred arrangement of the present invention, the solid particles of the electrode material include solid particles having an ordinary average particle size, and solid particles having an average particle size larger than the ordinary average size, or agglomerates produced by agglomerating a plurality of ordinary solid particles, so that the surface roughness values of the electrode film are held within the above-specified ranges.

More specifically, the electric conductor paste as described just above may be prepared by one of the following two methods: (A) forming a paste out of a powder mixture obtained by mixing together two or more kinds of solid particles having different average particle sizes; and (B) preparing two or more kinds of pastes by changing the state or degree of dispersion of one kind of solid particles having a predetermined average particle size, in the paste, and mixing the different kinds of pastes so as to provide an electric conductor paste similar to that obtained by the method (A).

Where the above-described method (A) is employed, the solid particles to be mixed together desirably have the average particle size in the range of 0.1 μm to 8 μm. More specifically, the solid particles serving as base particles of the paste desirably have the average particle size of 0.2 μm~2 μm, more preferably, 0.5 μm~1.5 μm. On the other hand, the solid particles to be added to the base particles have the average particle size larger than that of the base particles, which larger size is in the range of about 2 μm to 8 μm, more preferably, about 2.5 μm to 5 μm. These base particles and additional particles having the larger size are mixed in an appropriate proportion to provide a powder mixture, which is used for forming a desired paste by an ordinary method.

Where the above-described method (B) is employed, only one kind of solid particles of the electrode material, which has the average particle size of 0.2 μm~2 μm, for example, is used to prepare a base paste in which the particles are uniformly dispersed, and an additional paste to be mixed with the base paste, in which the particles are insufficiently dispersed. Then, these two kinds of pastes are mixed in an appropriate proportion to provide a desired electric conductor paste. In this method (B), a large number of the agglomerates formed in the additional paste function in the same manner as the solid particles having the larger particle size as in the method (A). The degree of dispersion of the solid particles in the paste is generally controlled by adjusting the time, temperature and other parameters in mixing the electrode material (solid particles) and an organic binder with an organic solvent to prepare the relevant paste. The degree of dispersion of the solid particles in the electric conductor paste is generally evaluated by a grind gauge.

In the above-described methods (A) and (B), the above-indicated proportion of the base particles (base paste) to the additional particles (additional paste) is preferably in a range of 50%:50% by weight to 90%:10% by weight, in order to achieve the above-indicated ranges of the surface roughness values of the electrode film.

For the same purpose, it is also effective to provide the electrode film with pores open on its surface required to exhibit the specified surface roughness, in addition to practicing the above-described method (A) or (B). In this case, the porosity of the electrode film should be controlled to be not higher than 25% by volume, more preferably, to be held in a range of 2~15% by volume. If the porosity is higher than 25% by volume, the pores may adversely reduce the surface area of the electrode film, and affect the electrical conductivity of the electrode film.

The porous electrode film as described above may be formed by various methods, such as: (a) reducing the content of the electrode material when mixing together the electrode material (solid particles), an organic binder and an organic solvent, to provide the paste; or (b) purposely lowering the degree of dispersion of the solid particles in the paste by adjusting the time, temperature and other parameters in preparing the paste from the mixture of the electrode material, organic binder and solvent; or (c) agglomerating the solid particles of the electrode material by adjusting the time and temperature of the heat treatment of the electrode film.

By using the thus prepared electric conductor paste, at least the lower one of the electrode films of the piezoelectric/electrostrictive portion is formed thereby to achieve the surface roughness Rmax. in the range of 3 μm to 14 μm and the surface roughness Ra of not larger than 2 μm. When leads, mounting parts, wires and other electrically conductive films or components other than the lower electrode film are formed, these conductive films or components may be formed of either the above-described electrode material used for the lower electrode film, or an ordinary electrically conductive material having as a major component gold or silver, or a silver-palladium alloy, for example.

Referring to the accompanying drawing showing one embodiment of the piezoelectric/electrostrictive element of the present invention, there is shown a lower electrode film 12 as an example of the lower electrode film as mentioned above. That is, the element of the instant embodiment has a three-layered piezoelectric/electrostrictive portion 18 formed on a thin-wall portion 10a of a ceramic substrate 10. The piezoelectric/electrostrictive portion 18 consists of the lower electrode film 12, a piezoelectric/electrostrictive film 14 and an upper electrode film 16. These films 12, 14, 16 are laminated in this order on the substrate 10. It is noted that the lower electrode film referred to with respect to the present invention does not include a lead portion 20 and other portions on which the piezoelectric/electrostrictive film 14 is not formed. In other words, the lead portion 20 formed as an integral extension from the lower electrode film 12 is not considered to be a part of the lower electrode as defined in the present application.

The electrode films 12, 16 are formed by any one of various known film-forming methods such as thick-film forming methods using the electric conductor paste as described above, and thin-film forming methods using the electrode material as described above. In particular, the lower electrode film 12 is preferably formed by thick-film forming techniques, such as screen printing, spraying, dipping or coating. The lower electrode film 12 has a thickness within a range of 1–30 μm, preferably within a range of 1–20 μm. The upper electrode film 16 may be formed by any thick-film forming techniques indicated above, or by thin-film forming techniques such as sputtering, ion-beam technique, vacuum vapor deposition, ion-plating, CVD and plating. The upper electrode film 16 has a thickness not greater than 20 μm, preferably, not greater than 5 μm.

Similarly, the piezoelectric/electrostrictive film 14 is formed by any known film-forming methods, using a known piezoelectric/electrostrictive material. Preferably, the film 14 is formed by thick-film forming techniques described above with respect to the electrode films 12, 16. The thickness of the film 14 is preferably not larger than 50 μm, and more preferably within a range of 3–40 μm, so that the film 14 is capable of undergoing a sufficient amount of displacement at a relatively low level of a voltage applied to the electrodes 12, 16. It is desirable that the film 14 be formed of a composition which contains as a major component lead zirconate titanate (PZT), lead magnesium niobate (PMN), lead nickel niobate (PNN), lead manganese niobate, lead antimony stannate, lead zinc niobate, lead titanate or lead zirconate, or a mixture of such materials. The piezoelectric/electrostrictive material (which may be a mixture of different materials) having the above-indicated major component may further contain as an additive an oxide or other compound of lanthanum, barium, niobium, zinc, cerium, cadmium, chromium, cobalt, antimony, iron, yttrium, tantalum, tungsten, nickel, manganese, lithium, strontium, calcium and/or bismuth, so as to provide a material containing PLZT, for example. However, addition of a glass material should be avoided, since the glass is likely to react with the lead-containing piezoelectric/electrostrictive material, such as PZT, making it difficult to establish a desired composition of the piezoelectric/electrostrictive film, and thereby causing an undesirable variation and deterioration of the operating characteristics of the element.

Among various piezoelectric/electrostrictive materials as indicated above, it is recommended to use a material whose major component is composed of lead magnesium niobate, lead zirconate and lead titanate, or composed of lead nickel niobate, lead magnesium niobate, lead zirconate and lead titanate. In particular, the material having the major component composed of lead magnesium niobate, lead zirconate and lead titanate is preferably used since this material is far less likely to react with the substrate material during heat-treatment thereof, and is therefore free from segregation of its components, whereby a desired composition or crystal structure can be easily obtained as a result of a suitable treatment for maintaining the composition. This material also has a relatively high piezoelectric constant, and is favorably used to form the piezoelectric/electrostrictive film by a thick-film forming method, such as screen printing, spraying, dipping and coating. While the piezoelectric/electrostrictive material containing plural components as described above has piezoelectric characteristics which vary depending upon the composition of the components, the three-component material composed of lead magnesium niobate, lead zirconate and lead titanate, which is favorably used to practice the present invention, preferably has a composition in the vicinity of phase boundaries of a pseudo-cubic crystal phase, a tetragonal crystal phase and a rhombohedral crystal phase. To assure sufficiently high levels of piezoelectric constant and electromechanical coupling factor, it is particularly desirable for the piezoelectric/electrostrictive material to have a composition containing 15~50 mole % of lead magnesium niobate, 10~45 mole % of lead zirconate, and 30~45 mole % of lead titanate.

While the ceramic substrate 10 is formed of any one of various known ceramic materials, it is particularly preferable to use a composition which contains as a major component zirconia having a crystal phase that is stabilized or partially stabilized by addition of at least one compound selected from the group consisting of yttrium oxide, ytterbium oxide, cerium oxide, calcium oxide, and magnesium oxide. The ceramic substrate made of this composition exhibits high degrees of mechanical strength and toughness even with a relatively small thickness thereof, and suffer from reduced thermal stresses during heat-treatment of the substrate with the piezoelectric/electrostrictive material. Further, the thus stabilized zirconia is less likely to react chemically with the piezoelectric/electrostrictive material. The thickness of the thin-walled portion 10a of the substrate 10 is generally not greater than 50 μm, preferably not greater than 30 μm, and more preferably not greater than 10 μm, in order to assure a high response and a sufficient amount of displacement of the piezoelectric/electrostrictive element upon energization of the piezoelectric/electrostrictive portion 18.

Then, a suitable heat treatment or firing operation is effected so as to integrate the ceramic substrate 10 with the electrode films 12, 16 and piezoelectric/electrostrictive film 14 formed on the substrate 10. In order to achieve the desired surface condition of the electrode film according to the present invention, the temperature of the heat treatment or firing is preferably held in a range of 900° C. to 1400° C., more preferably, in a range of 1000° C. to 1400° C. Such heat treatment or firing process may be effected when each of the lower electrode 12, piezoelectric/electrostrictive film 14 and upper electrode 16 is formed by a suitable film-forming method indicated above. Namely, the heat treatment is conducted at three different times: when the lower electrode film 12 is formed on the ceramic substrate 10; when the piezoelectric/electrostrictive film 14 is formed on the lower electrode film 12; and when the upper electrode film 16 is formed on the film 14. Alternatively, the lower electrode film 12 and the piezoelectric/electrostrictive film 14, or all the three films 12, 14, 16 of the piezoelectric/electrostrictive portion 18 may be heat-treated or fired concurrently. Where the upper electrode film 18 is formed by a thin-film forming technique, the heat treatment of the upper electrode film 18 is not essential.

EXAMPLES

To clarify further the concept of the present invention, there will be described some examples of piezoelectric/electrostrictive elements of the present invention. However, it is to be understood that the present invention is by no means limited to the details of these examples, but may be embodied with various changes, modifications and improvements, which may occur to those skilled in the art, without departing from the scope of the present invention defined in the appended claims.

Initially, five different electric conductor pastes were prepared from Pt powders having different average particle sizes. For the preparation of these conductor pastes, an acrylic binder and terpineol were used as a binder and an organic solvent, respectively.

Example 1

The conductor paste was prepared by: mixing together two Pt powders having respective average particle sizes of 0.8 μm and 3 μm, in a proportion of 4:1 by weight; adding the binder and organic solvent to the Pt powder mixture; and mixing them for one hour.

Example 2

The conductor paste was prepared by: adding the binder and organic solvent to a Pt powder having an average particle size of 1.5 μm; mixing together these components for one hour to prepare a first paste, and for 10 minutes to prepare a second paste; and mixing the first and second pastes in a proportion of 2:1 by weight.

Example 3

The conductor paste was prepared by: adding the binder and organic solvent to a Pt powder having an average particle size of 0.9 μm; mixing together these components for one hour to prepare a first paste, and for 10 minutes to prepare a second paste; and mixing the first and second pastes in a proportion of 3:1 by weight.

Comparative Example 1

The conductor paste was prepared by adding the binder and organic solvent to a Pt powder having an average particle size of 6 μm, and mixing together these components for one hour.

Comparative Example 2

The conductor paste was prepared by adding the binder and organic solvent to a Pt powder having an average particle size of 0.5 μm, and mixing together these components for one hour.

Using the conductor pastes prepared as described above, specimens of the piezoelectric/electrostrictive elements as shown in FIG. 1 were prepared. The ceramic substrate 10 of these elements was formed of zirconia partially stabilized by yttria, with the thin-walled portion 10a having a thickness of 10 μm. On this thin-walled portion 10a, there was formed the piezoelectric/electrostrictive portion 18 which has dimensions of 0.4 mm×8 mm (width×length). Described more specifically, the lower electrode film 12 was first formed on the thin-walled portion 10a of the substrate 10, by using the appropriate conductor paste described above, and was fired (heat-treated) at 1300° C. The fired lower electrode film 12 had a thickness of 5 μm. Then, the piezoelectric/electrostrictive film 14 was formed on the lower electrode film 12, using a composition consisting of lead magnesium niobate, lead titanate and lead zirconate, and was fired (heat-treated) at 1250° C. The fired film 14 had a thickness of 30 μm. Then, the upper electrode film 16 having a thickness of 0.2 μm was formed of Au by sputtering on the piezoelectric/electrostrictive film 14. Thus, the five specimens of the piezoelectric/electrostrictive elements were prepared using the different electric conductor pastes for the lower electrode film 12.

The lead portion 20 was formed as an integral part of the lower electrode film 12 on each of the specimens of Examples 1–3 and Comparative Examples 1 and 2. Namely, this lead portion 20 was formed from the same conductor paste as used for the lower electrode film 12. The surface roughness (Rmax. and Ra) of the lead portion 20 of each specimen was measured, and the measured values were used as the surface roughness of the lower electrode film 12. Further, the amount of displacement of the piezoelectric/electrostrictive element of each specimen measured by applying a voltage of 30 V between the lower and upper electrode films 12, 16. The measured values of the surface roughness of the lower electrode 12 and the displacement of the element are indicated in Table 1, together with percentage of cracking of the piezoelectric/electrostrictive film 14. The cracking test was conducted on 1000 pieces of the element according to each of the examples.

TABLE 1

|  | Examples | | | Comparative Examples | |
|---|---|---|---|---|---|
|  | 1 | 2 | 3 | 1 | 2 |
| Lower Electrode 12 Material | Pt | | | | |
| Powder particle size (μm)* | 0.8 + 3 | 1.5 | 0.9 | 6 | 0.5 |
| Film thickness | 5 μm | | | 10 μm | 5 μm |
| Firing temperature | 1300° C. | | | | |
| Surface Roughness (μm) | | | | | |
| Rmax. | 6.4 | 9.3 | 4.0 | 16 | 1.9 |
| Ra | 0.7 | 1.2 | 0.4 | 3.4 | 0.2 |
| Cracking % of P/E film 14 | 0.3 | 0.5 | 0.4 | 1 | 4 |
| Displacement of element (μm) | 0.6 | 0.5 | 0.6 | 0.3 | 0.3 |

*"Powder particle size" represents the average particle size of the Pt powder used for preparing the conductor paste of each example.

Further, four different electric conductor pastes were prepared from Pt powders having different average particle sizes, to prepare corresponding specimens of piezoelectric/electrostrictive element according to Examples 4 and 5 and Comparative Examples 3 and 4. The details of the lower electrode film 12 of each specimen are indicated Table 2 below.

Example 4

The conductor paste was prepared by: mixing together two Pt powders having respective average particle sizes of about 0.6 μm and about 3 μm, in a proportion of 3:2 by weight; adding the binder and organic solvent to the Pt powder mixture; and mixing them for one hour.

Example 5

The conductor paste was prepared by: adding the binder and organic solvent to a Pt powder having an average particle size of about 1 μm; mixing together these components for one hour to prepare a first paste, and for 10 minutes to prepare a second paste; and mixing the first and second pastes in a proportion of 3:1 by weight.

Comparative Example 3

The conductor paste was prepared by adding the binder and organic solvent to a Pt powder having an average particle size of 0.6 μm, and mixing together these components for one hour.

Comparative Example 4

The conductor paste was prepared by adding the binder and organic solvent to a Pt powder having an average particle size of 7 μm, and mixing together these components for one hour.

Using the conductor paste specimens prepared as described above, specimens of the piezoelectric/electrostrictive elements were prepared in the same manner as described above with respect to Examples 1–3 and Comparative Examples 1 and 2. However, the piezoelectric/electrostrictive portion 18 of each specimen was formed to have dimensions of 0.8 mm×3 mm (width×length). The surface roughness values (R max. and Ra) of the lower electrode film 12, displacement amount of the element and the cracking percentage of the film 14 were measured of the specimens according to Examples 4 and 5 and Comparative Examples 3 and 4. The measured values are indicated in Table 2.

TABLE 2

|  | Examples | | Comparative Examples | |
|---|---|---|---|---|
|  | 4 | 5 | 3 | 4 |
| Lower Electrode 12 Material | Pt | | | |
| Powder particle size (μm) | 0.6 + 3 | 1.0 | 0.6 | 7 |
| Film thickness | 5 μm | | | 10 μm |
| Firing temperature | 1300° C. | | | |
| Surface Roughness (μm) | | | | |
| Rmax. | 7.8 | 9.3 | 2.0 | 18 |
| Ra | 0.7 | 1.0 | 0.5 | 3.8 |
| Cracking % of P/E film 14 | 0.6 | 0.7 | 8 | 1 |
| Displacement | 1.9 | 1.8 | 1.1 | 1.2 |

TABLE 2-continued

|  | Examples | | Comparative Examples | |
|---|---|---|---|---|
|  | 4 | 5 | 3 | 4 |
| of element (μm) | | | | |

*"Powder particle size" represents the average particle size of the Pt powder used for preparing the conductor paste of each example.

It will be apparent from the results indicated in Tables 1 and 2 that the cracking percentage of the piezoelectric/electrostrictive film 14 was relatively low, while the amount of displacement of the piezoelectric/electrostrictive element was comparatively large, according to Examples 1–5 in which the surface roughness values Rmax. and Ra of the lower electrode film 12 were held within the above-explained specified ranges according to the present invention. Comparative examples 1–4 exhibited relatively poor results in the cracking percentage and displacement amount.

Further comparative examples were prepared such that the surface roughness values Rmax. and Ra of the lower electrode film are outside the specified ranges according to the invention. Some of these comparative examples whose lower electrode films have a relatively high degree of surface flatness suffered from local or partial separation or peel-off of the piezoelectric/electrostrictive film, while the other comparative examples suffered from dielectric breakdown upon application of an voltage to measure the displacement amount.

What is claimed is:

1. A piezoelectric/electrostrictive element including a ceramic substrate, and at least one piezoelectric/electrostrictive portion each of which consists of a lower electrode film, a piezoelectric/electrostrictive film and an upper electrode film, which are laminated on the ceramic substrate in the order of description and formed into an integral laminar structure by heat treatment of at least said lower electrode film and said piezoelectric/electrostrictive film, wherein at least said lower electrode film has a first surface roughness represented by maximum peak-to-valley roughness height Rmax. which is in a range of 3 μm~14 μm, and a second surface roughness represented by centerline mean roughness Ra which is not larger than 2 μm.

2. A piezoelectric/electrostrictive element as defined in claim 1, wherein said first surface roughness Rmax. is in a range of 5 μm~10 μm.

3. A piezoelectric/electrostrictive element as defined in claim 1, wherein said second surface roughness Ra is not larger than 1 μm.

4. A piezoelectric/electrostrictive element including a ceramic substrate, and at least one piezoelectric/electrostrictive portion each of which consists of a lower electrode film, a piezoelectric/electrostrictive film and an upper electrode film, which are laminated on the ceramic substrate in the order of description and formed into an integral laminar structure by heat treatment of at least said lower electrode film and said piezoelectric/electrostrictive film, wherein at least said lower electrode film has a first surface roughness represented by maximum peak-to-valley roughness height Rmax, which is in a range of 3 μm~14 μm, has a second surface roughness represented by centerline mean roughness Ra which is not larger than 2 μm, and is formed from an electric conductor paste comprising a powder material which is a mixture of at least two kinds of solid particles having different average particle sizes.

5. A piezoelectric/electrostrictive element as defined in claim 4, wherein said powder material has an average particle size in a range of 0.1 μm to 8 μm.

6. A piezoelectric/electrostrictive element as defined in claim 4, wherein said mixture of at least two kinds of solid particles comprises first solid particles having a predetermined first average particle size, and second solid particles having a second average particle size larger than said first average particle size.

7. A piezoelectric/electrostrictive element as defined in claim 6, wherein said first solid particles have an average particle size in a range of 0.2 μm to 2 μm, and said second solid particles have an average particle size in a range of 2 μm to 8 μm.

8. A piezoelectric/electrostrictive element as defined in claim 7, wherein said first solid particles have an average particle size in a range of 0.5 μm to 1.5 μm, and said second solid particles have an average particle size in a range of 2.5 μm to 5 μm.

9. A piezoelectric/electrostrictive element as defined in claim 6, wherein the proportion of said first solid particles to said second solid particles is in a range of 50%:50% by weight to 90%:10% by weight.

10. A piezoelectric/electrostrictive element including a ceramic substrate, and at least one piezoelectric/electrostrictive portion each of which consists of a lower electrode film, a piezoelectric/electrostrictive film and an upper electrode film, which are laminated on the ceramic substrate in the order of description and formed into an integral laminar structure by heat treatment of at least said lower electrode film and said piezoelectric/electrostrictive film, wherein at least said lower electrode film has a first surface roughness represented by maximum peak-to-valley roughness height Rmax. which is in a range of 3 μm~14 μm, has a second surface roughness represented by centerline mean roughness Ra which is not larger than 2 μm, and is formed from at least two kinds of electric conductor pastes having different degrees of dispersion of solid particles for forming the lower electrode film, said solid particles having a predetermined average particle size.

11. A piezoelectric/electrostrictive element as defined in claim 10, wherein said predetermined average particle size of said solid particles is in a range of 0.2 μm to 2 μm.

12. A piezoelectric/electrostrictive element as defined in claim 10, wherein said at least two kinds of electric conductor pastes comprises a first conductor paste in which said solid particles are uniformly dispersed, and a second conductor paste in which said solid particles are insufficiently dispersed, the proportion of said first conductor paste to said second conductor paste being in a range of 50%:50% by weight to 90%:10% by weight.

13. A piezoelectric/electrostrictive element as defined in claim 1, wherein said lower electrode film consists of a porous electrode film having pores which are open on a surface thereof on which said piezoelectric/electrostrictive film is formed.

14. A piezoelectric/electrostrictive element as defined in claim 1, wherein said lower electrode film has a thickness within a range of 1–30 μm.

15. A piezoelectric/electrostrictive element as defined in claim 1, wherein said upper electrode film has a thickness not greater than 20 μm.

16. A piezoelectric/electrostrictive element as defined in claim 1, wherein said piezoelectric/electrostrictive film has a thickness not greater than 50 μm.

17. A piezoelectric/electrostrictive element as defined in claim 1, wherein said ceramic substrate, said upper and lower electrode films and said piezoelectric/electrostrictive film are heat-treated at a temperature of 900° C.~1400° C.

* * * * *